(12) United States Patent
Byun et al.

(10) Patent No.: US 8,734,686 B2
(45) Date of Patent: May 27, 2014

(54) METAL PATTERN COMPOSITION AND METHOD OF FORMING METAL PATTERN USING THE SAME

(75) Inventors: Young-Hun Byun, Suwon-si (KR);
Jae-Ho Lee, Yongin-si (KR);
Young-Hwan Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 675 days.

(21) Appl. No.: 12/879,596

(22) Filed: Sep. 10, 2010

(65) Prior Publication Data

US 2011/0059234 A1 Mar. 10, 2011

(30) Foreign Application Priority Data

Sep. 10, 2009 (KR) .................. 10-2009-0085594

(51) Int. Cl.
*H01B 1/02* (2006.01)
*B05D 5/12* (2006.01)

(52) U.S. Cl.
USPC ....... 252/512; 106/1.05; 252/519.3; 252/513; 252/514; 252/515; 427/123; 427/125; 427/126.1

(58) Field of Classification Search
USPC ....................... 252/500; 427/126.1
See application file for complete search history.

(56) References Cited

U.S. PATENT DOCUMENTS

| 6,605,142 | B1 | 8/2003 | Kenworthy et al. | |
|---|---|---|---|---|
| 7,867,316 | B2 | 1/2011 | Jun et al. | |
| 2008/0178761 | A1* | 7/2008 | Tomotake et al. | 106/1.26 |
| 2008/0206488 | A1* | 8/2008 | Chung et al. | 427/596 |
| 2008/0241391 | A1* | 10/2008 | Kim et al. | 427/256 |

FOREIGN PATENT DOCUMENTS

| JP | 2004-327186 A | 11/2004 |
|---|---|---|
| JP | 2009-120940 A | 6/2009 |
| KR | 10-2006-0112025 A | 10/2006 |

OTHER PUBLICATIONS

Japanese Office Action for Japanese Patent Application No. 2010-203751 dated Feb. 18, 2014 with English Translation.

* cited by examiner

*Primary Examiner* — Harold Pyon
*Assistant Examiner* — Katie L Hammer
(74) *Attorney, Agent, or Firm* — Cantor Colburn LLP

(57) ABSTRACT

Disclosed is a metal pattern composition including a conductive metal or a conductive metal precursor compound, and a carboxylic acid-amine base ion pair salt.

29 Claims, 8 Drawing Sheets

METAL PATTERN COMPOSITION AND METHOD OF FORMING METAL PATTERN USING THE SAME

CROSS-REFERENCE TO RELATED APPLICATION

This application claims priority to Korean Patent Application No. 10-2009-0085594, filed on Sep. 10, 2009, and all the benefits accruing therefrom under 35 U.S.C. §119, the content of which in its entirety is herein incorporated by reference.

BACKGROUND

1. Field

This disclosure relates to a metal pattern composition and a method of forming the metal pattern composition. This disclosure further relates to a metal pattern formed using the metal pattern composition, and a method of forming a metal pattern using the metal pattern composition.

2. Description of the Related Art

A patterned metal thin film may be formed by disposing a thin film of a metal or an organometallic precursor on a substrate and patterning the thin film. The thin film may be utilized in various types of electronic devices. Such electronic devices may be produced by coating a material for forming the thin film on a crystalline silicon wafer and patterning the thin film. For example, one method of forming a metal pattern includes disposing an organometallic material on a silicon or glass substrate using chemical vapor deposition ("CVD") or atomic layer deposition ("ALD") to provide a thin film, spin coating a photosensitive resin thereon, using photolithography to form a pattern, and removing the photosensitive resin using an etching process to form a metal pattern.

Alternatively, a metal pattern may be provided by forming a metal layer using plasma deposition, sputtering, electroplating or the like, coating a photosensitive resin thereon, and using a pattern forming process using irradiation with light and an etching process, to provide a metal pattern. However, these conventional methods generally employ a high temperature and a high vacuum, which is provided by a high vacuum apparatus, and include a patterning process using a photosensitive resin and an etching process to remove the photosensitive resin. Thus these methods generally include a plurality of processes, which undesirably increase cost.

Generally, photolithography includes applying a photosensitive resin on a surface of a substrate, irradiating with visible light, X-rays, or an electron beam to change the properties of selected regions, removing an exposed or non-exposed portion of the photosensitive resin, and performing chemical treatment or deposition of a material for the metal pattern. However, the resolution of a resulting metal pattern may be deteriorated by repeated use of the foregoing processes. In addition, the deposited material may have an uneven surface, such that it may be desirable to include an additional planarization process.

Generally, the metal of a metal pattern is deposited by a physical process, but a layer provided by diffusing metal vapor into the substrate at a high temperature may adversely affect the function of the device, thereby degrading the performance of the device.

SUMMARY

According to an aspect, a metal pattern composition includes a conductive metal or a conductive metal precursor compound, and a carboxylic acid-amine base ion pair salt.

The conductive metal may include a Group 3 to Group 12 element, a main group metal, or a combination thereof, and the conductive metal precursor compound may be represented by the following Chemical Formula 1.

$$M_l L_n X_m \quad \text{Chemical Formula 1}$$

In Chemical Formula 1, each M is independently a Group 3 to Group 12 element, a main group metal, or a combination thereof, each L is independently an amine ligand, a phosphine ligand, a phosphite ligand, a phosphine oxide ligand, an arsine ligand, a thiol ligand, or a combination thereof, each X is independently a hydrogen, a hydroxy, a halogen, a cyano, a cyanate, a carbonate, a nitrate, a nitrite, a sulfate, a sulfite, a phosphate, a chlorate, a perchlorate, a tetrafluoroborate, an acetylacetonate, a thiol, an amide, an alkoxy, a carboxylate, a β-diketonate, a β-ketoiminate, a β-diiminate, a carboxy ester, an oxo, a dialkyldithiocarbamate, a nitroxyl, an azide, a thiocyanate, an isothiocyanate, a tetraalkylborate, a tetrahaloborate, a hexafluorophosphate, a triflate, a tosylate, or a combination thereof, and l is an integer ranging from 1 to about 10, n is an integer ranging from 0 to about 40, and m is an integer ranging from 0 to about 10, provided that both n and m are not 0.

The conductive metal or the conductive metal precursor compound may have an average largest particle diameter of about 1 to about 5000 nm.

The carboxylic acid-amine base ion pair salt may be represented by the following Chemical Formula 2.

$$R_1-(CR_a R_b)_x-\overset{O}{\underset{O^- \;^+R_5 N - R_3}{C}}\!\!\!\!\diagdown R_2 \atop R_4 \quad \text{Chemical Formula 2}$$

In the above Chemical Formula 2, $R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C2 to C12 alkenyloxy, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, each of the foregoing being optionally substituted with an amino or carbonyl functional group, $R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen, and for example, at least one of $R_2$ to $R_4$ is a substituted or unsubstituted C1 to C18 alkyl, $R_5$ is a hydrogen or a C1 to C7 alkyl, $R_a$ and $R_b$ are the same or different, and are each independently a hydrogen or a C1 to C7 alkyl, and x is an integer ranging from 0 to about 17.

$R_1$ may be a substituent represented by the following Chemical Formula 2-1.

Chemical Formula 2-1

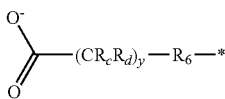

In the above Chemical Formula 2-1, $R_c$ and $R_d$ are the same or different, and are each independently a hydrogen or a C1 to C7 alkyl, $R_6$ is a single bond, a substituted or unsubstituted C1 to C18 alkylene, a substituted or unsubstituted C3 to C20 cycloalkylene, or a substituted or unsubstituted C6 to C30 arylene, and y is an integer ranging from 0 to about 17.

At least one of $R_2$ to $R_4$ may be represented by the following Chemical Formula 3-1.

Chemical Formula 3-1

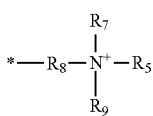

In the above Chemical Formula 3-1, $R_7$ and $R_9$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, $R_5$ is a hydrogen or a C1 to C7 alkyl, and $R_8$ is a substituted or unsubstituted C1 to C18 alkylene, a substituted or unsubstituted C2 to C18 alkenylene, a substituted or unsubstituted C3 to C20 cycloalkylene, a substituted or unsubstituted C7 to C30 alkylarylene, a substituted or unsubstituted C7 to C30 arylalkylene, or a substituted or unsubstituted C6 to C30 arylene.

The metal pattern composition may include about 1 weight percent (wt %) to about 99 wt % of a metal ion derived from the conductive metal or the conductive metal precursor compound, based on the total weight of the metal pattern composition, and in an embodiment, the metal pattern composition includes about 5 wt % to about 70 wt % of metal ions.

The carboxylic acid-amine base ion pair salt may be included in an amount of about 1 wt % to about 99 wt % based on the total weight of the metal pattern composition.

The carboxylic acid-amine base ion pair salt has a boiling point of about 80 to about 300° C., wherein the boiling point is measured using differential thermal analysis ("DTA") of a curved line of thermogravimetric analysis (TGA).

The metal pattern composition has a viscosity of about 1 centipoise (cps) to about 100,000 cps.

The metal pattern composition may further include a conductive metal nanoparticle.

The metal pattern composition may further include a functional additive, such as an adhesive, a dispersing agent, a binder resin, a reducing agent, a surfactant, a humectant, a viscoelasticity controlling agent, a leveling agent, or a combination thereof.

According to an aspect, a method of manufacturing a metal pattern composition includes combining a conductive metal or a conductive metal precursor compound and a carboxylic acid-amine base ion pair salt to provide a metal pattern composition.

According to an aspect, a method of manufacturing a metal pattern includes forming the pattern on a substrate with a metal pattern composition, the metal pattern composition including a conductive metal or a metal precursor compound, and a carboxylic acid-amine base ion pair salt, and annealing the pattern to provide the metal pattern.

The annealing may be performed at about 100 to about 400° C., and in another embodiment, at about 150 to about 250° C. The metal pattern may be annealed using a laser, ultraviolet ("UV") rays, or microwaves.

According to an aspect, a metal pattern having a line resistance of about 50 to about 500 ohms per meter (Ω/m) or a resistivity of about 3 to about 500 microohms centimeters (μΩcm) is provided.

Also disclosed is a method of manufacturing a metal pattern which includes providing a metal pattern composition including a metal and a carboxylic acid-amine base ion pair salt; and disposing the metal pattern composition on a substrate to provide the metal pattern, wherein the metal is platinum, palladium, silver, gold, or a combination thereof.

Hereinafter, further aspects will be disclosed in further detail.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
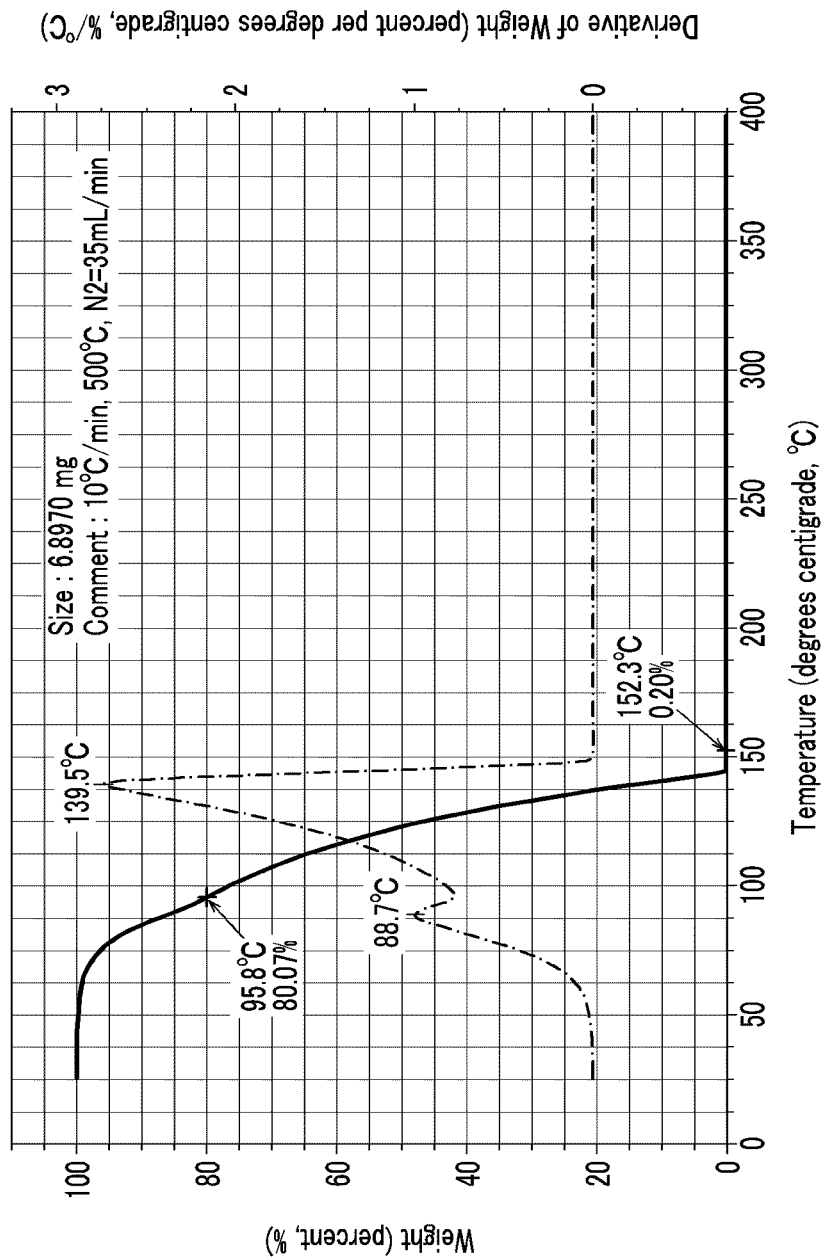
FIG. 1 is a graph of weight (percent, %) and derivative of weight (percent per degrees centigrade, %/° C.) versus temperature (degrees centigrade, ° C.) of TGA analysis results of a formic acid-isopropyl amine ion pair salt according to Example 1-1.

This disclosure will be described more fully hereinafter with reference to the accompanying drawings, in which embodiments are shown. This disclosure may, however, be embodied in many different forms and is not to be construed as limited to the exemplary embodiments set forth herein. Rather, these embodiments are provided so that this disclosure will be thorough and complete, and will fully convey the inventive principles to those skilled in the art. Like reference numerals refer to like elements throughout.

It will be understood that when an element such as a layer, film, or substrate is referred to as being "on" another element, it may be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs.

As used herein, "alkoxy," refers to an alkyl moiety that is linked via an oxygen (i.e., —O-alkyl).

As used herein, "alkoxyalkyl" refers to an alkyl radical substituted with one or more alkoxy groups.

As used herein "alkyl" refers to a straight or branched chain saturated aliphatic hydrocarbon having the specified number of carbon atoms, specifically 1 to 12 carbon atoms, more specifically 1 to 6 carbon atoms.

As used herein, "alkylene" refers to a straight or branched divalent aliphatic hydrocarbon group, and may have from 1 to about 18 carbon atoms, more specifically 1 to about 12 carbon atoms.

As used herein, "amide" generally refers to the group —C(O)NRR, wherein each R is independently hydrogen, a C1 to C6 alkyl, or a C6 to C12 aryl.

As used herein, "amino" has the general formula —N(R)$_2$, wherein each R is independently hydrogen, a C1 to C6 alkyl, or a C6 to C12 aryl.

As used herein, "arsine" has the general formula As(R)$_3$, wherein each R is independently hydrogen, an alkyl, or an aryl.

As used herein, "aryl" means a cyclic moiety in which all ring members are carbon and at least one ring is aromatic. More than one ring may be present, and any additional rings may be independently aromatic, saturated or partially unsaturated, and may be fused, pendant, spirocyclic or a combination thereof.

As used herein, the term "arylene" refers to a divalent radical formed by the removal of two hydrogen atoms from one or more rings of an aromatic hydrocarbon, wherein the hydrogen atoms may be removed from the same or different rings (preferably different rings), each of which rings may be aromatic or nonaromatic.

As used herein, "cycloalkoxy" includes a cycloalkyl group linked through an oxygen atom, such as cyclopentyloxy and cyclohexyloxy.

As used herein, "cycloalkoxyalkyl" refers to an alkyl radical substituted with one or more cycloalkoxy groups.

As used herein, "cycloalkyl" refers to a group that comprises one or more saturated and/or partially saturated rings in which all ring members are carbon, such as cyclopropyl, cyclobutyl, cyclopentyl, cyclohexyl, cycloheptyl, cyclooctyl, adamantyl, and partially saturated variants of the foregoing, such as cycloalkenyl groups (e.g., cyclohexenyl) or cycloalkynyl groups. Cycloalkyl groups do not comprise an aromatic ring or a heterocyclic ring.

As used herein, "cycloalkylene" refers to a bivalent cyclic alkylene radical having the formula —$C_nH_{2n-x}$, wherein x represents the number of hydrogens replaced by cyclization(s).

As used herein, "fluoroalkyl" refers to an alkyl group in which at least one hydrogen is replaced with fluorine. "Perfluoroalkyl" refers to an alkyl group in which all hydrogens are replaced with fluorine.

"Group" as used herein refers to a Group of the Periodic Table of the Elements according to the International Union of Pure and Applied Chemistry ("IUPAC") Group classification system.

As used herein, halogen refers to an element of Group 17 of the periodic table (e.g., fluorine, chlorine, bromine, iodine, and astatine). As used herein, the prefix "hetero" refers to a group or compound including at least one ring member that is a heteroatom (e.g., 1 to 4 heteroatoms) each independently N, O, S, Si, or P.

As used herein, "phosphine" has the general formula —P(R)$_3$, wherein each R is independently hydrogen, an alkyl group, or an aryl group.

As used herein, "phosphine oxide" has the general formula —PO(R)$_3$, wherein each R is independently hydrogen, an alkyl group, or an aryl group.

As used herein, the term "substituted" refers to a compound or radical substituted with at least one (e.g., 1, 2, 3, 4, 5, 6 or more) substituents independently selected from a halide (e.g., F$^-$, Cl, Br$^-$, I$^-$), a hydroxyl, a C1 to C30 linear or branched alkyl, a C3 to C30 cycloalkyl, a C1 to C20 fluoroalkyl, a C1 to C20 perfluoroalkyl ($C_nF_{2n+1}$), a C1 to C30 linear or branched alkoxy, a C3 to C30 cycloalkoxy, a C2 to C30 linear or branched alkoxyalkyl, a C4 to C30 cycloalkoxyalkyl, a nitro, a cyano, an amino, a carbonyl, a thiol, a C1 to C6 alkoxylcarbonyl, a carboxyl, or a combination thereof, instead of hydrogen, provided that the substituted atom's normal valence is not exceeded. In a specific embodiment, a group is optionally substituted with an amino group, a carbonyl group, or a combination thereof only. A substituent may be substituted with another substituent, or at least two substituents may form a fused ring.

As used herein, "triflate" refers to a trifluoromethanesulfonate group, which has the formula —CF$_3$SO$_3$.

As used herein, "tosylate" refers to a group having the formula —CH$_3$C$_6$H$_4$SO$_2$ or —CH$_3$C$_6$H$_4$SO$_2^-$.

A metal pattern composition according to an embodiment includes a conductive metal or a conductive metal precursor compound, and a carboxylic acid-amine base ion pair salt.

The conductive metal, which may be included in the metal pattern composition, may enhance the conductivity of the metal pattern. The metal is not limited, and may include, for example, a Group 3 to Group 12 element or a main group metal. A main group metal may be a metal of Group 13 to Group 16. Particularly, the conductive metal may include a Group 6 element, a Group 7 element, a Group 8 element, a Group 9 element, a Group 10 element, a Group 11 element, a Group 12 element, a metal of Group 13 to Group 14, or a combination thereof. Exemplary metals include molybdenum (Mo), chromium (Cr), tungsten (W), nickel (Ni), palladium (Pd), platinum (Pt), zinc (Zn), copper (Cu), silver (Ag), gold (Au), aluminum (Al), gallium (Ga), indium (In), or tin (Sn), or a combination thereof, so as to improve the electrical conductivity and the adherence of the printed conductive layer formed using the metal pattern composition. In addition, if copper nanoparticles are included in the metal pattern composition, the copper nanoparticles may be easily oxidized, decreasing the electrical conductivity of a conductive metal layer formed from the metal pattern composition, which is economically undesirable. However, because the metal pattern composition may have excellent stability against oxidation, the stability of the copper nanoparticles may be improved. In an embodiment, the conductive metal may be used singularly, or as a mixture of at least two different metals, or the metal may include at least two different metal alloys.

The conductive metal precursor compound readily provides metal ions, and may be an organometallic compound, a metal salt, or the like, or a combination thereof. For example, the conductive metal precursor compound may be represented by the following Chemical Formula 1.

  Chemical Formula 1

In the Chemical Formula 1, each M is independently a Group 3 to Group 12 element, a main group metal, or a combination thereof, each L is independently an amine ligand, a phosphine ligand, a phosphite ligand, a phosphine oxide ligand, an arsine ligand, or a thiol ligand, or a combination thereof, each X is independently hydrogen, a hydroxy, a halogen, a cyano (—CN), a cyanate (—OCN), a carbonate (—CO$_3$), a nitrate (—NO$_3$), a nitrite (—NO$_2$), a sulfate (—SO$_4$), a sulfite (—SO$_3$), a phosphate (—PO$_3$H or —PO$_4$), a chlorate (—ClO$_3$), a perchlorate (—ClO$_4$), a tetrafluoroborate (—BF$_4$), an acetylacetonate (—C$_5$H$_7$O$_2$, —O—C(CH$_3$)=CHCOCH$_3$), a thiol (—SR, wherein R is hydrogen, a C1 to C18 alkyl or a C6 to C20 aryl), a secondary amino (—NHR, wherein R is alkyl or carbonylalkyl), a carbamoyl (—CONH$_2$), an alkoxy (—OR, wherein R is a C1 to C18 alkyl or a C6 to C20 aryl), a carboxylate (—COOR, wherein R is hydrogen, a C1 to C18 alkyl or a C6 to C20 aryl), a β-diketonate (Chemical Formula 1A), a β-ketoiminate (Chemical Formula 1B), a β-diiminate (Chemical Formula 1C), a dialkyldithiocarbamate (Chemical Formula 1D), an oxo (O$^{2-}$, Chemical Formula 1E), a nitroxyl (—HNO or —NO), an azide (—N$_3$), a thiocyanate (—SCN), an isothiocyanate (—NCS), a tetraalkylborate (—BR$_4$, wherein R is hydrogen, a C1 to C18 alkyl or a C6 to C20 aryl), a tetrahaloborate (—BX$_4$, wherein X is a halogen), a hexafluorophosphate (PF$_6^-$), a trifluoromethanesulfonate (i.e., triflate, —CF$_3$SO$_3$), or a tosylate (-Ts, CH$_3$C$_6$H$_4$SO$_3^-$), or a combination thereof:

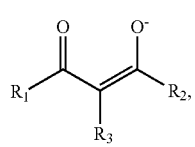

Chemical Formula 1A

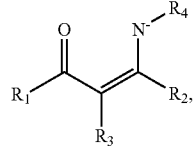

Chemical Formula 1B

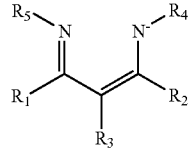

Chemical Formula 1C

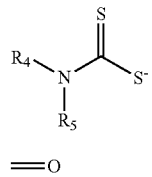

Chemical Formula 1D

=O    Chemical Formula 1E

In the Chemical Formulae 1A to 1D, each $R_1$ and $R_2$ is an alkyl (e.g., a C1 to C18 alkyl, specifically a C1 to C6 alkyl) or an aryl (e.g., a C6 to C20 aryl), and each $R_3$ to $R_5$ is hydrogen or an alkyl (e.g., a C1 to C18 alkyl, specifically a C1-C6 alkyl).

In Chemical Formula 1, l is an integer ranging from 1 to about 10, specifically 2 to about 8, more specifically about 3 to about 6, n is an integer ranging from 0 to about 40, specifically 1 to about 35, more specifically 2 to about 30, and m is an integer ranging from 0 to about 10, specifically 1 to about 9, more specifically 2 to about 8, provided that both n and m are not 0.

In Chemical Formula 1, M may be a Group 3 to Group 12 element, a main group metal, or a combination thereof, and M may be the same as the conductive metal. In an embodiment, the main group metal is a metal of Group 13 to Group 16.

The conductive metal or the conductive metal precursor compound may have a particle diameter of about 1 to about 5000 nanometers (nm), specifically about 10 to about 4000 nm, more specifically about 100 to about 3000 nm.

The metal pattern composition may include a metal ion derived from the conductive metal or the conductive metal precursor compound in an amount of about 1 to about 99 weight percent (wt %), specifically about 1 to about 90 wt %, more specifically about 5 to about 70 wt %, or more specifically still about 10 to about 70 wt %, based on the total amount of metal pattern composition. According to an embodiment, when the metal pattern composition includes the metal ion derived from the conductive metal or the conductive metal precursor compound within the foregoing range, it is possible to easily control the thickness of the metal pattern.

The disclosed compositions and methods have several advantages over the art where, generally, an ink or paste for forming the metal pattern is prepared by synthesizing metal particles. The paste may be prepared by reducing the conductive metal precursor compound and combining (e.g., mixing) metal particles having various diameters with the reduced metal precursor compound. However, copper is easily oxidized in the air, and thus it is difficult to obtain the paste commercially. In particular, the ink may be prepared by synthesizing a metal nanoparticle from the conductive metal precursor compound, separating the same, and re-dispersing the same in a suitable solvent. In this case, the metal nanoparticles are subjected to synthesizing, separating, and re-dispersing processes, which may result in decreased yield and a more complex process. Alternatively, the conductive metal precursor compound may be used to provide an ink without separation and re-dispersion, however this alternative has a drawback in that such an ink has a low concentration of the metal. In contrast, and as disclosed herein, the metal pattern composition, according to an embodiment, is formed into a paste or filtered to provide an ink without any further treatment, such that it is possible to considerably simplify the manufacturing process and to provide an ink which is stable to oxidation. It is also possible to provide a high concentration of the metal, and a metal pattern having a desirable thickness.

The carboxylic acid-amine base ion pair salt may include a salt represented by the following Chemical Formula 2.

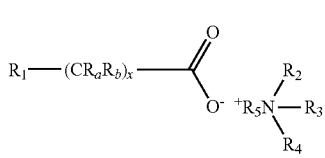

Chemical Formula 2

In the above Chemical Formula 2, $R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C3 to C20 cycloalkyl, a substituted or unsubstituted C2 to C12 alkenyloxy, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, each of the foregoing being optionally substituted with an amino or carbonyl functional group, $R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen, and for example, at least one of $R_2$ to $R_4$ is a substituted or unsubstituted C1 to C18 alkyl, $R_5$ is a hydrogen or a C1 to C7 alkyl, $R_a$ and $R_b$ are the same or different, and are each independently a hydrogen or a C1 to C7 alkyl, and x is an integer ranging from 0 to about 17, specifically 1 to about 15, more specifically 2 to about 14, provided that at least one of $R_2$ to $R_4$ is not hydrogen, and for example, at least one of $R_2$ to $R_4$ is a substituted or unsubstituted C1 to C18 alkyl.

In an embodiment of Chemical Formula 2, when $R_1$ is a hydrophobic group, $R_2$ to $R_4$ are hydrophilic groups, or vice versa, and the carboxylic acid-amine base ion pair salt may be an amphiphilic compound. Such an amphiphilic compound may facilitate mixing of the metal pattern composition with the optionally added metal nanoparticle or metal precursor compound to increase the metal concentration. The viscosity is controlled by the content of the mixture, specifically by the amount of the ion pair salt and any metal nanoparticles or metal compounds included in the mixture, to enable easy manufacture of a metal pattern, which may be an alloy wire.

$R_1$ may be a substituent represented by the following Chemical Formula 2-1.

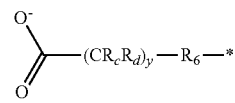

Chemical Formula 2-1

In the above Chemical Formula 2-1, $R_c$ and $R_d$ are the same or different, and are each independently hydrogen or a C1 to C7 alkyl, $R_6$ is a single bond, a substituted or unsubstituted C1 to C18 alkylene, a substituted or unsubstituted C3 to C20 cycloalkylene or a substituted or unsubstituted C6 to C30 arylene, and y is an integer ranging from 0 to about 17, specifically 1 to about 15, more specifically 2 to about 13, still more specifically about 3 to about 8.

When $R_1$ is the above Chemical Formula 2-1, the carboxylic acid-amine base ion pair salt may be represented by the following Chemical Formula 2-2.

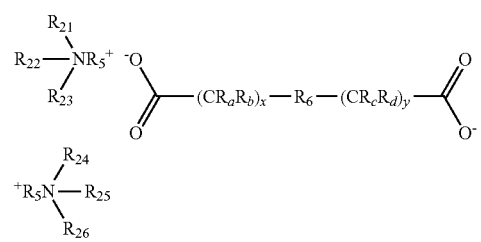

Chemical Formula 2-2

In the above Chemical Formula 2-2, $R_{21}$ to $R_{26}$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_{21}$ to $R_{24}$ and one of $R_{24}$ to $R_{26}$ is a substituted or unsubstituted C1 to C18 alkyl, $R_a$ to $R_d$ are the same or different, and are each independently hydrogen or a C1 to C7 alkyl, each $R_5$ is independently a hydrogen or a C1 to C7 alkyl, $R_6$ is a substituted or unsubstituted C1 to C18 alkylene, a substituted or unsubstituted C3 to C20 cycloalkylene, or a substituted or unsubstituted C6 to C30 arylene, and x and y are each independently an integer ranging from 0 to about 9, specifically 1 to about 8, more specifically 2 to about 6.

In an embodiment, at least one of $R_2$ to $R_4$ of Chemical Formula 2 is represented by the following Chemical Formula 3-1.

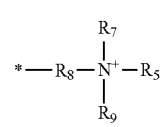

Chemical Formula 3-1

In the above Chemical Formula 3-1, $R_7$ and $R_9$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, $R_5$ is a hydrogen or a C1 to C7 alkyl, and $R_8$ is a substituted or unsubstituted C1 to C18 alkylene, a substituted or unsubstituted C2 to C18 alkenylene, a substituted or unsubstituted C3 to C20 cycloalkylene, a substituted or unsubstituted C7 to C30 alkylarylene, a substituted or unsubstituted C7 to C30 arylalkylene, or a substituted or unsubstituted C6 to C30 arylene.

When at least one of $R_2$ to $R_4$ is the above Chemical Formula 3-1, the carboxylic acid-amine base ion pair salt may be represented by the following Chemical Formula 3-2.

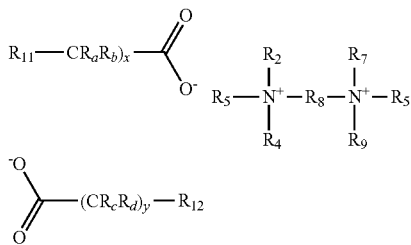

Chemical Formula 3-2

In the above Chemical Formula 3-2, $R_{11}$ and $R_{12}$ are the same or different, and are each independently a hydrogen, a substituted or unsubstituted C1 to C18 alkyl, a substituted or unsubstituted C1 to C12 alkoxy, a substituted or unsubstituted C3 to C20 cycloalkyl, a substituted or unsubstituted C6 to C30 aryl, a substituted or unsubstituted C6 to C30 heteroaryl, an amino, a carbonyl, or a substituted or unsubstituted C1 to C18 alkoxy carbonyl, $R_a$ to $R_d$ are the same or different, and are each independently a hydrogen or a C1 to C7 alkyl, $R_5$ is a hydrogen or a C1 to C7 alkyl, $R_8$ is a substituted or unsubstituted C1 to C18 alkylene, a substituted or unsubstituted C2 to C18 alkenylene, a substituted or unsubstituted C3 to C20 cycloalkylene, a substituted or unsubstituted C7 to C30 alkylarylene, a substituted or unsubstituted C7 to C30 arylalkylene, or a substituted or unsubstituted C6 to C30 arylene, and x and y are independently integers ranging from 0 to about 18, specifically 1 to about 16, more specifically about 2 to about 14.

Without being bound by theory, it is believed that the carboxylic acid-amine base ion pair salt improves dispersion the conductive metal or the conductive metal precursor compound and acts as a reducing agent in the metal pattern composition, thereby decreasing the annealing temperature of a subsequent annealing process.

The carboxylic acid-amine base ion pair salt has a boiling point of about 80 to about 300° C., wherein the boiling point is measured from Differential Thermal Analysis ("DTA") line of Thermogravimetric Analysis ("TGA"). In an embodiment the boiling point is about 100 to about 300° C., specifically about 150 to about 250° C.

The carboxylic acid-amine base ion pair salt may be present as a liquid and may act as a solvent. Particularly, when $R_1$ is an alkyl group, specifically a long chain alkyl group (e.g., a C6 to C18 alkyl group), the alkyl group may improve the solubility and the dispersing properties of the conductive metal or the conductive metal precursor compound. In addition, the viscosity of the metal pattern composition may be controlled by adding an additional salt to the carboxylic acid-amine base ion pair salt. Accordingly, the metal pattern composition may have a viscosity of about 1 to about 100,000 centipoise (cps), specifically about 10 to about 10,000 cps, more specifically 100 to about 1,000 cps. For example, the metal pattern composition may have a viscosity of about 1 to about 20 cps, and according to another embodiment, it may have viscosity of about 5 to about 12 cps, and may be in the form of an ink. Alternatively, metal pattern composition may have viscosity ranging from about 100 to about 10,000 cps, and according to another embodiment, it may have viscosity ranging from about 3000 to about 6000 cps, and may be in the form of a slurry. In addition, the metal pattern composition may have viscosity ranging from about 10,000 to about 100,000 cps, and according to another embodiment, it may have viscosity ranging from about 20,000 to about 60,000 cps, and may be in the form of a paste. The metal pattern composition may improve workability and reduce process cost because it may be coated on the substrate while forming the metal pattern.

Another embodiment of a method of preparing a metal pattern composition includes adding a base to a metal precursor compound and then adding an acid to the same. When the acid is added to the metal precursor compound, the conductive metal precursor compound may be partially decomposed due to a highly exothermic reaction which may occur when the acid is added, reducing the yield and forming decomposed metal particles. The decomposed metal particles are understood to cause an uneven composition. In addition, when the acid and the base are not added in a sufficiently accurate stoichiometric ratio, the excess acid or base may bind to the metal to generate a precipitate, causing deterioration of the dispersion. In order to solve these and other problems, in an embodiment, the metal precursor compound is added to a solvent to form a mixture, the base is added to the mixture, and then the acid is slowly added to form a metal pattern composition. However, in such a process, the duration of the reaction may be prolonged, and excess solvent may be present in the resulting metal pattern composition. The excess solvent may be removed in an additional process.

However, in another embodiment wherein the carboxylic acid-amine base ion pair salt is preliminarily prepared, the acid and the base may be present in a more accurate stoichiometric ratio, thereby increasing the yield of the metal pattern composition. Thus, when the conductive metal precursor compound is added to the carboxylic acid-amine base ion pair salt (e.g., the carboxylic acid-amine base ion pair salt is prepared before addition of the conductive metal precursor compound), the problem of decomposition of the conductive metal precursor compound may be avoided, the dispersion may be improved, and the process may be simplified.

The carboxylic acid-amine base ion pair salt may be included in an amount of about 1 to about 99 weight percent (wt %), specifically about 1 to about 95 wt %, more specifically about 5 to about 70 wt %, more specifically still about 10 to about 50 wt %, based on the total weight of metal pattern composition, and depending whether the ion pair salt acts as a solvent. Depending upon the printing process, it is possible to select the viscosity and to provide excellent dispersion.

The metal pattern composition may further include a solvent. The solvent may be included in balance, and the amount may be selected to be an effective amount for controlling the viscosity of the metal pattern composition and for easily forming the thin film. The solvent may include an aqueous or a non-aqueous solvent, and the type of solvent is not specifically limited. Exemplary solvents include water; an alcohol such as methanol, ethanol, isopropanol, 1-methoxypropanol, butanol, ethylhexyl alcohol, or terpineol, or the like; a glycol such as ethyleneglycol, or glycerine, or the like; an acetate such as ethyl acetate, butyl acetate, methoxypropyl acetate, carbitol acetate, or ethylcarbitol acetate, or the like; an ether such as methylcellosolve, butylcellosolve, diethylether, tetrahydrofuran, or dioxane, or the like; a ketone such as methylethylketone, acetone, dimethyl formamide, or 1-methyl 2-pyrrolidone, or the like; a hydrocarbon such as hexane, heptane, dodecane, or paraffin oil, or the like; an aromatic solvent such as benzene, toluene, or xylene, or the like; a halogenated solvent such as chloroform, methylene chloride, or carbon tetrachloride, or the like; acetonitrile; dimethyl sulfoxide; or a combination thereof.

The metal pattern composition may further include a conductive metal nanoparticle.

The conductive metal nanoparticle may include the above mentioned conductive metal, and, for example, may include a metal having a higher reduction potential than that of the conductive metal or the conductive metal of the conductive metal precursor compound. For example, the reduction potential of silver (Ag) is higher than the reduction potential of copper, as illustrated in Reaction Scheme 1. Thus in an embodiment silver nanoparticles may be added to a metal pattern composition comprising copper. When a metal nanoparticle having a reduction potential lower than that of copper is added to a metal pattern composition including copper, the added metal nanoparticle may be easily ionized, and copper particles may precipitate from the metal pattern composition. In this embodiment, the dispersion may be deteriorated, and it may be difficult to use the dispersion as an ink or paste composition.

Reaction Scheme 1

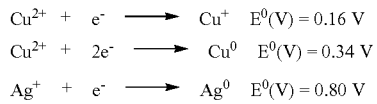

The conductive metal nanoparticle may be included in an amount of about 1 to about 50 parts by weight, specifically about 2 to about 45 parts by weight, more specifically about 4 to about 40 parts by weight, based on 100 parts by weight of the metal pattern composition. When the metal nanoparticle is included within the foregoing range, it may provide the additional benefit of further increasing the metal concentration in the metal pattern composition.

The metal pattern composition may further include an functional additive, which may be an adhesive, a dispersing agent, a binder resin, a reducing agent, a surfactant, a humectant, a viscoelasticity controlling agent, a leveling agent, or a combination thereof. Such functional additives can be identified by one of ordinary skill in the art without undue experimentation, and the type thereof is not specifically limited but it may include the following additives as examples.

The adhesive may include a thermosetting resin, such as an epoxy resin or an acryl based resin, polyvinyl pyrrolidone ("PVP"), polyvinyl alcohol ("PVA"), polyamine, a silane coupling agent, or the like or a combination thereof.

The dispersing agent may be included to facilitate dispersion of the conductive metal nanoparticle, the conductive metal, or the conductive metal precursor compound. For example, the dispersing agent may include a CIBA® EFKA® 4000 series dispersant (available from Ciba Specialty Chemicals), a DISPERBYK® series dispersant (available from BYK), a Solsperse® series dispersant (available from Avecia), a TEGO® Dispers series dispersant (available from Degussa), a Disperse-AYD® series dispersant (available from Elementis Specialties, Inc.), a JONCRYL® series dispersant (available from Johnson polymer), or the like, or a combination thereof.

The binder resin may include an organic resin and may include an acrylic resin, such as polyacrylic acid or polyacrylic acid ester; a cellulosic resin such as ethyl cellulose, cellulose ester, or cellulose nitrate, or the like; an aliphatic or copolymerized polyester resin; a vinyl resin such as polyvinylbutyral, polyvinylacetate, or polyvinylpyrrolidone, or the like; a polyamide resin; a polyurethane resin; a polyether resin; a urea resin; an alkyd resin; a silicone resin; a fluorinated resin; an olefin resin such as polyethylene or polystyrene; a thermoplastic resin such as a petroleum or rosin-based resin; an epoxy resin; an unsaturated or vinyl polyester resin; diallylphthalate resin; a phenolic resin; oxetane resin; an oxazine resin; a bismaleimide resin; a modified silicone resin such as a silicone epoxy or a silicone polyester; a thermosetting resin such as a melamine resin; a ultraviolet ("UV") or electron beam curable acrylic resin having various structures; or a natural polymer such as ethylene-propylene rubber ("EPR"), styrene-butadiene rubber ("SBR"), starch, or gelatin, or the like, or a combination thereof. Further, in addition to the organic resin, the binder resin may include an inorganic binder such as a glass resin; a glass frit, or a silane coupling agent such as trimethoxy propyl silane or vinyl triethoxy silane; or a titanium, zirconium, or aluminum containing coupling agent.

In addition, in order to facilitate the firing process, a reducing agent may be further added to the metal pattern composition. For example, it may include an amine compound such as hydrazine, acetic hydrazide, sodium or potassium borohydride, trisodium citrate, or methyldiethanolamine, dimethylamineborane; a metal salt such as iron (II) chloride, iron lactate; an aldehyde compound such as hydrogen, hydrogen iodide, carbon monoxide, formaldehyde, acetaldehyde; or an organic compound such as glucose, ascorbic acid, salicylic acid, tannic acid, pyrogallol, hydroquinone, or the like, or a combination thereof.

The surfactant may include an anionic surfactant such as sodium lauryl sulfate; a non-ionic surfactant such as nonyl phenoxy-polyethoxyethanol, ZONYL®FSN which is manufactured by DuPont; a cationic surfactant such as laurylbenzylammonium chloride; or an amphiphilic surfactant such as lauryl betaine, coco betaine, or the like, or a combination thereof.

The humectant may include a compound such as polyethyleneglycol, a SURFYNOL® series material manufactured by Air Products, a TEGO® WET series material manufactured by Deguessa, or the like, or a combination thereof.

The viscoelasticity controlling agent or the leveling agent may include a BYK® series material manufactured by BYK, a TEGO® Glide series material manufactured by Degussa, CIBA®EFKA 3000 series material manufactured by EFKA, a DSX® series material manufactured by Cognis, or the like, or a combination thereof.

The metal pattern composition may be used to easily provide a thin film or a pattern on a substrate by a coating or printing process.

In an embodiment, a conductive metal or a conductive metal precursor compound, and a carboxylic acid-amine base ion pair salt are first added to a solvent to provide a metal pattern composition. The metal pattern composition is coated on a substrate, and the metal pattern composition is annealed to provide a metal pattern.

In another embodiment, a carboxylic acid-amine base ion pair salt is prepared and added to a conductive metal or a conductive metal precursor compound to form a mixture, and then this mixture is added to a solvent to provide a metal pattern composition. The metal pattern composition is then coated on a substrate, and the metal pattern composition is annealed to provide a metal pattern.

In an embodiment wherein a metal and a carboxylic acid-amine base ion pair salt are combined to provide a metal pattern composition, if the metal is a noble metal, the annealing may be omitted. The noble metal may be platinum, palladium, silver, gold, or a combination thereof. Thus a method of manufacturing a metal pattern may include combining a noble metal and a carboxylic acid-amine base ion pair salt to provide a metal pattern composition, and disposing the metal pattern composition on a substrate to provide the metal pattern.

The substrate may include metal, glass, silicon wafer, ceramic, a plastic film such as polyester or polyimide, a rubber sheet, fiber, wood, paper, or the like, or a combination thereof. The substrate may be prepared by washing, wherein the washing may include removing grease, or the substrate may be prepared by a selected pre-process treatment. The pre-processing treatment may include exposure to a plasma, an ion beam, a corona, or exposure to an oxidizing or a reducing compound, and the pre-process treatment may include heating, etching, exposure to ultraviolet ("UV") radiation, or a primer treatment using the binder or the additive. The thin film forming and printing method may selectively include spin coating, roll coating, spray coating, dip coating, flow coating, doctor blade coating, dispensing, Inkjet printing, offset printing, screen printing, pad printing, gravure printing, flexography printing, stencil printing, imprinting, xerography, or lithography, or the like.

The annealing process may be performed at a temperature of about 100 to about 400° C., specifically about 150 to about 250° C., more specifically at about 175 to about 225° C., under a reducing atmosphere, such as an atmosphere comprising hydrogen, an inert gas atmosphere, such as an atmosphere comprising helium, nitrogen or argon, or in air. While not wanting to be bound by theory, it is believed that it is possible to perform the annealing process at a low temperature because the carboxylic acid-amine base ion pair salt acts as a reducing agent.

Because the disclosed metal pattern composition is annealed at a low temperature, it is applicable to a substrate that is not sufficiently stable at a high temperature. In an embodiment the substrate may be a plastic.

The disclosed metal patterning method may be substituted for a layer of a flat panel display or a flexible display formed by sputtering, may be used for processing chemical mechanical planarization ("CMP")-free damascene, may be used for forming a photoresist ("PR")-free indium tin oxide ("ITO") layer, or may be used for forming the electrode of a solar cell.

The metal pattern may have a line resistance of about 50 to about 500 ohms per meter ($\Omega$/m), specifically about 100 to about 450 $\Omega$/m, more specifically about 150 to about 400 $\Omega$/m, and may have a resistivity of about 3 to about 500 microohms centimeters ($\mu\Omega$cm), specifically about 5 to about 450 $\mu\Omega$cm, more specifically 10 to about 400 $\mu\Omega$cm. The metal pattern may have a sheet resistance of 1 to 100 milliohms per square (m$\Omega$/□), specifically 2 to 90 m$\Omega$/□, more specifically 4 to 80 m$\Omega$/□.

Because the metal pattern composition includes, in an embodiment, a small amount of an additive, it is possible to provide a uniform and safe metal pattern composition even when the metal pattern composition is fired or annealed at a low temperature. When the disclosed metal pattern composition is used, it is possible to improve the electrical conductivity of a printed line, or a conductive layer, or the like, for example.

In addition, the disclosed method of manufacturing the metal pattern composition has economic benefits because additional processes, such as synthesizing the metal particle, filtering, and washing, may be omitted. Thereby, it is possible to manufacture the metal pattern in a faster and simpler method. The process is environment-friendly, economical, and safe, making it useful in a variety of industries.

Hereinafter, the embodiments are illustrated in further detail with reference to examples. However, the following are exemplary embodiments and shall not be limiting.

Preparation of Carboxylic Acid-Amine Base Ion Pair Salt

Example 1-1

A 100 milliliter (ml) quantity of hexane solvent is introduced into a 500 ml two-neck round-bottom flask, isopropyl amine (1 mole, 59 grams, g) is added, and the mixture is agitated. A reflux condenser and a dropping funnel are mounted thereto, and formic acid (1 mol, 46 g) is added to the dropping funnel, and the formic acid is added in a dropwise fashion for 1 hour 30 minutes. The formic acid is slowly added in a dropwise fashion because white fumes and heat are generated in the flask during the reaction. In order to complete the reaction, after reacting for about one hour, the hexane solvent is partially removed under vacuum to generate a white solid. The solid is filtered and washed with cold hexane two times to provide a formic acid-isopropylamine ion pair salt. The yield is about 95%.

The obtained formic acid-isopropylamine ion pair salt is subjected to TGA analysis (10° C./minute (min), 500° C., $N_2$: 35 ml/min, Universal V4.5A TA instruments), and the results are shown in FIG. 1. As shown in FIG. 1, it is confirmed that the formic acid-isopropylamine ion pair salt has high thermal stability.

Example 1-2

A 100 ml quantity of hexane solvent is added to a 500 ml two-neck round-bottom flask, hexyl amine (0.5 mole (mol), 50.6 g) is added, and the mixture is agitated. A reflux condenser and a dropping funnel are mounted thereto, and formic acid (0.5 mol, 23 g) is added to the dropping funnel and the formic acid is added in a dropwise fashion for 1 hour. The formic acid is slowly added in a dropwise fashion because white fumes and heat are generated in the flask during the reaction. In order to complete the reaction, the hexane solvent is completely removed under vacuum after being further reacted for about one hour to generate a slightly viscous liquid. The liquid is a formic acid-hexylamine ion pair salt, and the yield is about 95%.

Example 1-3

A formic acid-octylamine ion pair salt is prepared in accordance with the same procedure as in Example 1-2, except that octylamine is used instead of hexylamine.

Figure 2:
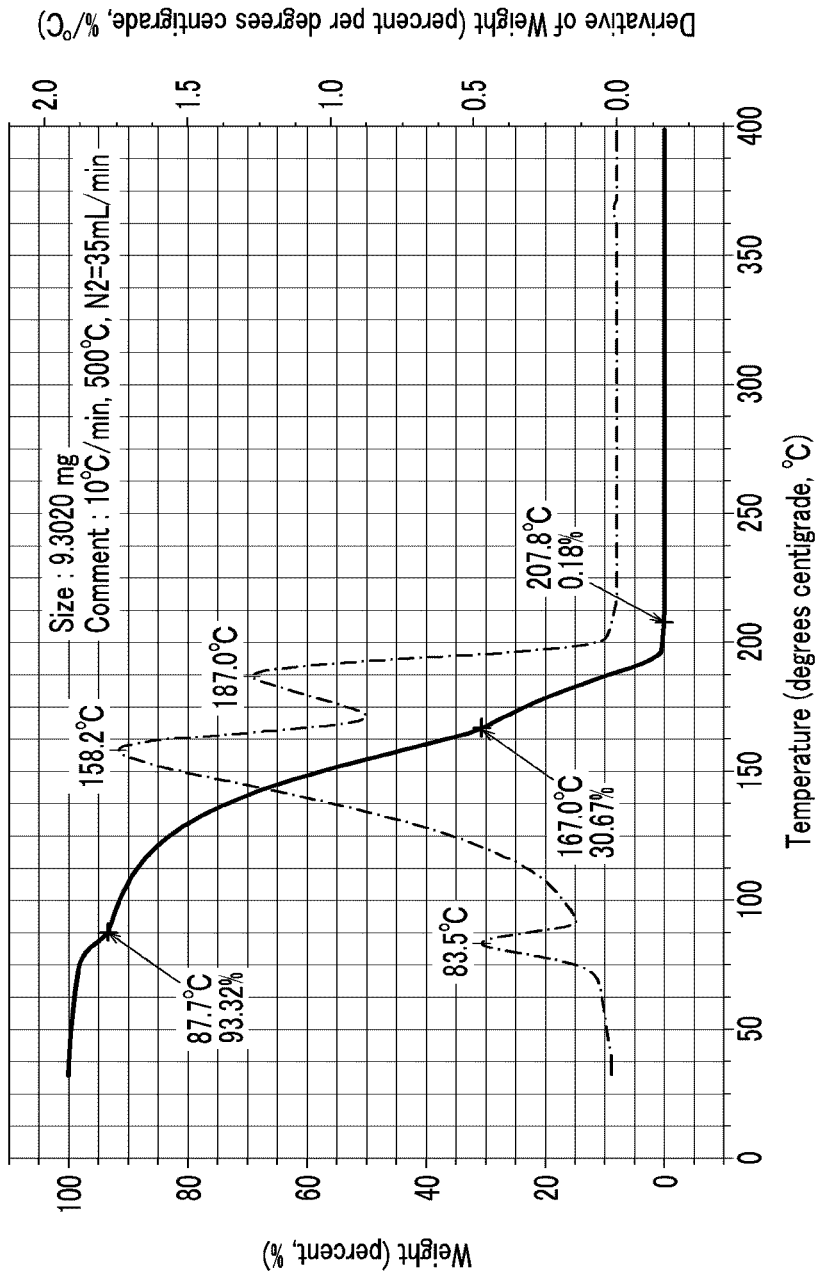
FIG. 2 is a graph of weight (percent, %) and derivative of weight (percent per degrees centigrade, %/° C.) versus temperature (degrees centigrade, ° C.) of TGA analysis results of a formic acid-n-octyl amine ion pair salt according to Example 1-3.

The obtained formic acid-n-octyl amine ion pair salt is subjected to TGA analysis (10° C./min, 500° C., $N_2$: 35 ml/min, Universal V4.5A TA instruments), and the results are shown in FIG. 2. As shown in FIG. 2, it is confirmed that the formic acid-n-octyl amine ion pair salt has higher thermal stability than formic acid or octyl amine individually.

Example 1-4

A formic acid-butylamine ion pair salt is prepared in accordance with the same procedure as in Example 1-2, except that butyl amine is used instead of hexyl amine.

Preparing Metal Pattern Composition

Example 1

A 10 weight percent (wt %) quantity of Cu $(OH)_2$ is added to 20 wt % of the formic acid-hexylamine ion pair salt obtained from Example 1-2 and mixed with a balance of N-methylpyrrolidone ("NMP") solvent to provide a metal pattern composition.

Figure 3:
FIG. 3 is a photograph of an exemplary embodiment of a pattern made using the metal pattern composition according to Example 1.

The metal pattern composition is patterned on a polyimide film using a pen and annealed at 190° C. to provide a pattern. The pattern is shown in FIG. 3. From FIG. 3, it is understood that a fine metal pattern is obtained. The result of measuring the line resistance of the pattern ten times is 100 to 200 ohms per meter ("$\Omega/m$"). The average line resistance is 130 ohms per meter.

Example 2

A 90 wt % quantity of $Cu(OH)_2$ is added to 5 wt % of formic acid-hexylamine ion pair salt obtained from Example 1-2 and mixed with a balance of NMP solvent to provide a metal pattern composition.

Figure 4:
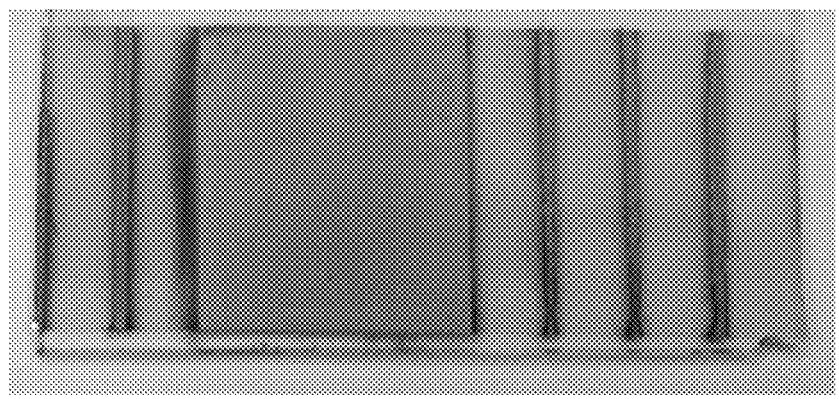
FIGS. 4 to 8 are photographs of exemplary embodiments of patterns made using the metal pattern composition according to Examples 2 to 6, respectively.

The metal pattern composition is coated on the polyimide film in a thickness of about 10 microns with a doctor blade and annealed at 190° C. for 5 minutes to provide a pattern. The pattern is shown in FIG. 4. The result of measuring the sheet resistance 10 times shows that the sheet resistance of the pattern is 8 to 15 milliohms per square ($m\Omega/\square$) and the result of measuring the resistivity 10 times shows that the resistivity is 8 to 15 microohms centimeters ($\mu\Omega cm$). The average sheet resistance is 10 milliohms per square, and the average resistivity is 10 microohms centimeters.

Comparative Example 1

A 9 g (90 wt %) quantity of $Cu(OH)_2$ is added to a 100 ml round-bottom flask and 0.5 g (5 wt %) of NMP solvent is added thereto. The $Cu(OH)_2$ is partially wet. Continuously, 0.344 g of hexyl amine is added and 0.156 g of formic acid is slowly added in a dropwise fashion. In this comparative example, a hot spot is locally generated to produce a decomposed Cu compound and to partially produce $Cu(formate)_2$, thus it is difficult to obtain a uniform composition.

Example 3

A 80 wt % quantity of $Cu(OH)_2$ is added to 10 wt % of the formic acid-n-octylamine ion pair salt obtained from Example 1-3, and a balance of ethylene glycol solvent is added to provide a metal pattern composition.

Figure 5:
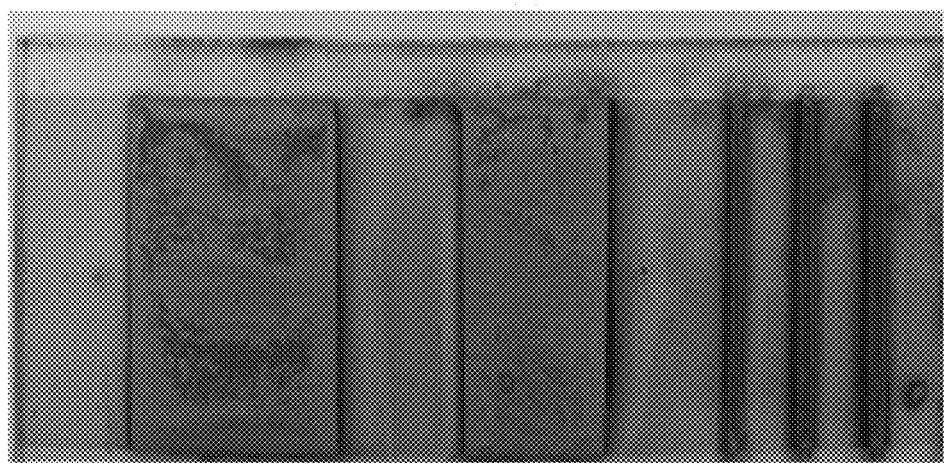

The metal pattern composition is coated on a polyimide film in a thickness of about 15 microns using a doctor blade, and annealed at 190° C. for 5 minutes to provide a pattern. The pattern is shown in FIG. 5. The result of measuring the sheet resistance of the pattern 10 times is 20 to 50 $m\Omega/\square$, and the results of measuring the resistivity 10 times is 30 to 75 $\mu\Omega cm$. The average sheet resistance is 30 $m\Omega/\square$ and the average resistivity is 45 microohms centimeters.

Comparative Example 2

A 8 g (80 wt %) quantity of $Cu(OH)_2$ is added to a 100 mL round-bottom flask, and 1.0 g (10 wt %) of ethylene glycol solvent is added thereto. The $Cu(OH)_2$ is partially wet. Continuously, 0.736 g of octyl amine is added and slowly added to 0.264 g of formic acid in a dropwise fashion. The local hot spot is generated to produce a decomposed Cu compound and to produce $Cu(formate)_2$, thus it is difficult to obtain a uniform composition.

Example 4

A 60 wt % quantity of $Cu(NO_3)_2$ is added to 10 wt % of the formic acid-n-octylamine ion pair salt obtained from Example 1-3, and the balance of a mixed solvent (1:1 (volume:volume, v:v)) of NMP and ethylene glycol is added to provide a metal pattern composition.

Figure 6:
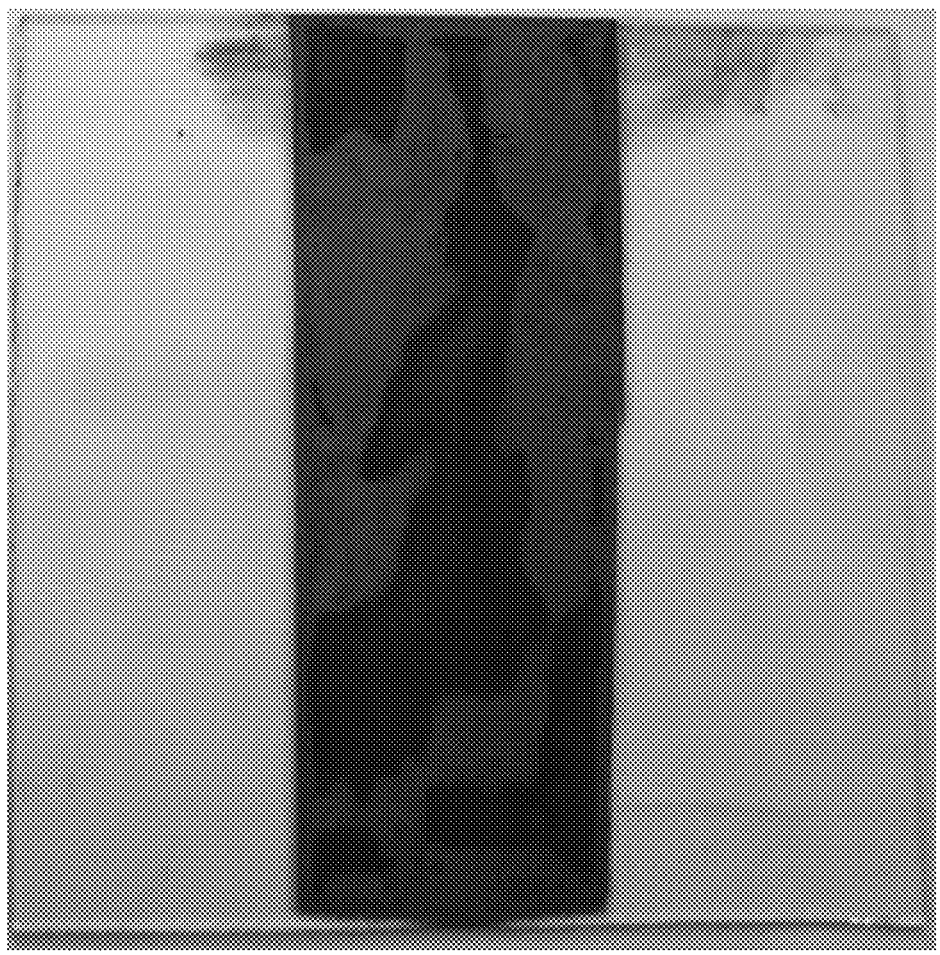

The metal pattern composition is coated on a polyimide film in a thickness of about 1.5 microns by a doctor blade, and annealed at 190° C. for 5 minutes to provide a pattern. The pattern is shown in FIG. 6. The result of measuring the sheet resistance of the pattern 10 times is 1 to 1.5$\Omega/\square$, and the result of measuring the resistivity 10 times is 150 to 225 $\mu\Omega cm$. The average sheet resistance is 1.2 ohms per square, and the average resistivity is 184 microohms centimeters.

Example 5

A 30 wt % quantity of $Cu(OH)_2$ and 30 wt % of Ag nanoparticles are added to 10 wt % of formic acid-hexylamine ion pair salt obtained from Example 1-2 and mixed with the balance of a mixed solvent (1:1 (v/v)) of NMP and isopropyl alcohol to provide a metal pattern composition.

Figure 7:
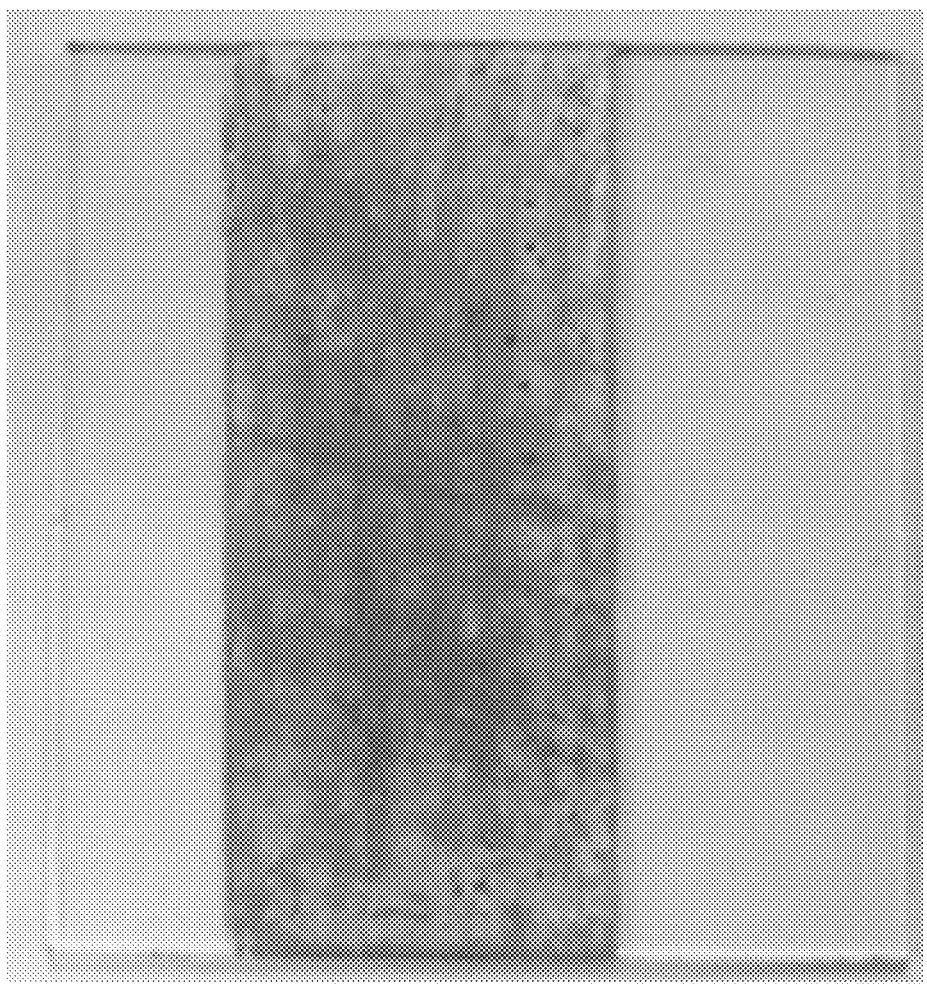

The metal pattern composition is coated on a glass in a thickness of about 15 microns by a doctor blade, and annealed at 190° C. for 5 minutes to provide a pattern. The pattern is shown in FIG. 7. The result of measuring the sheet resistance of the pattern 10 times is 10 to 17 $m\Omega/\square$, and the result of measuring the resistivity 10 times is 15 to 25 $\mu\Omega cm$. The average sheet resistance is 13 milliohms per square, and the average resistivity is 18 microohms centimeters.

Example 6

A 70 wt % quantity of $Cu(OH)_2$ is added to 10 wt % of the formic acid-butylamine ion pair salt obtained from Examples 1-4, and the balance of a mixed solvent of hexylamine and tetrahydrofuran is added to provide a metal pattern composition.

Figure 8:
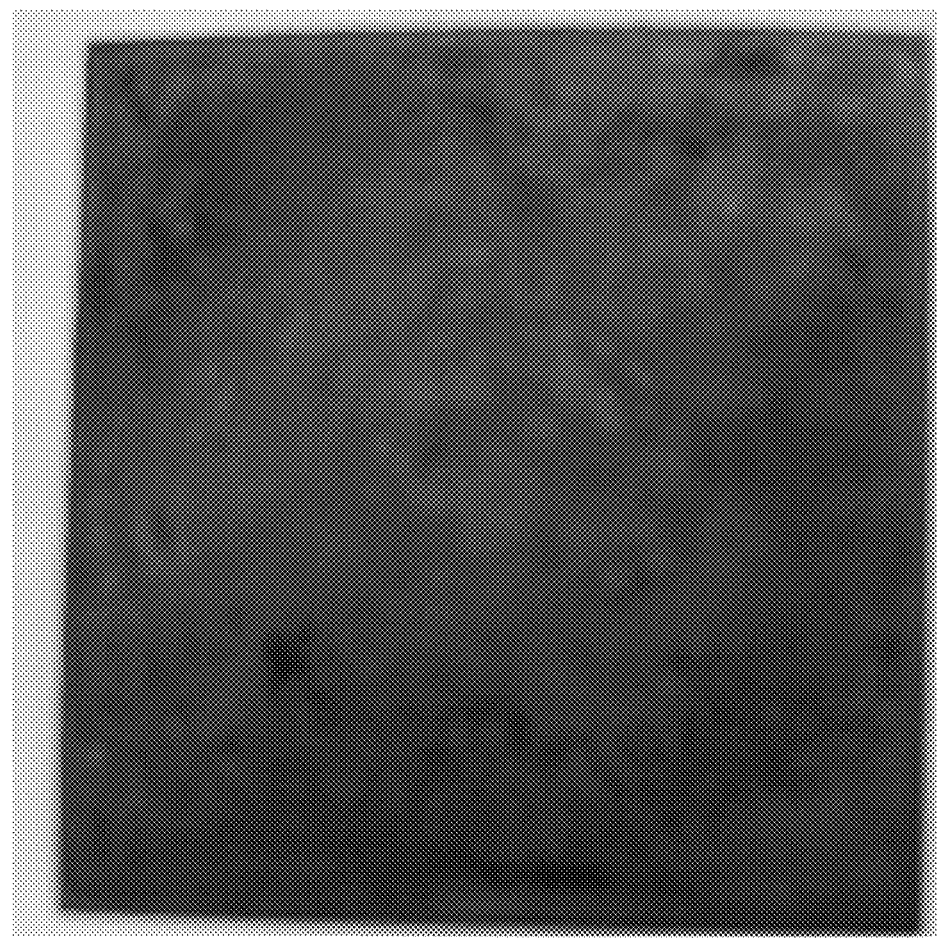

The metal pattern composition is coated on a PES film in a thickness of about 5 microns by a doctor blade, and annealed at 170° C. for 5 minutes to provide a pattern. The pattern is shown in FIG. 8. The average result of measuring the sheet resistance of pattern 10 times is 500 $m\Omega/\square$, and the average result of measuring the resistivity is 250 $\mu\Omega cm$.

Figure 9:
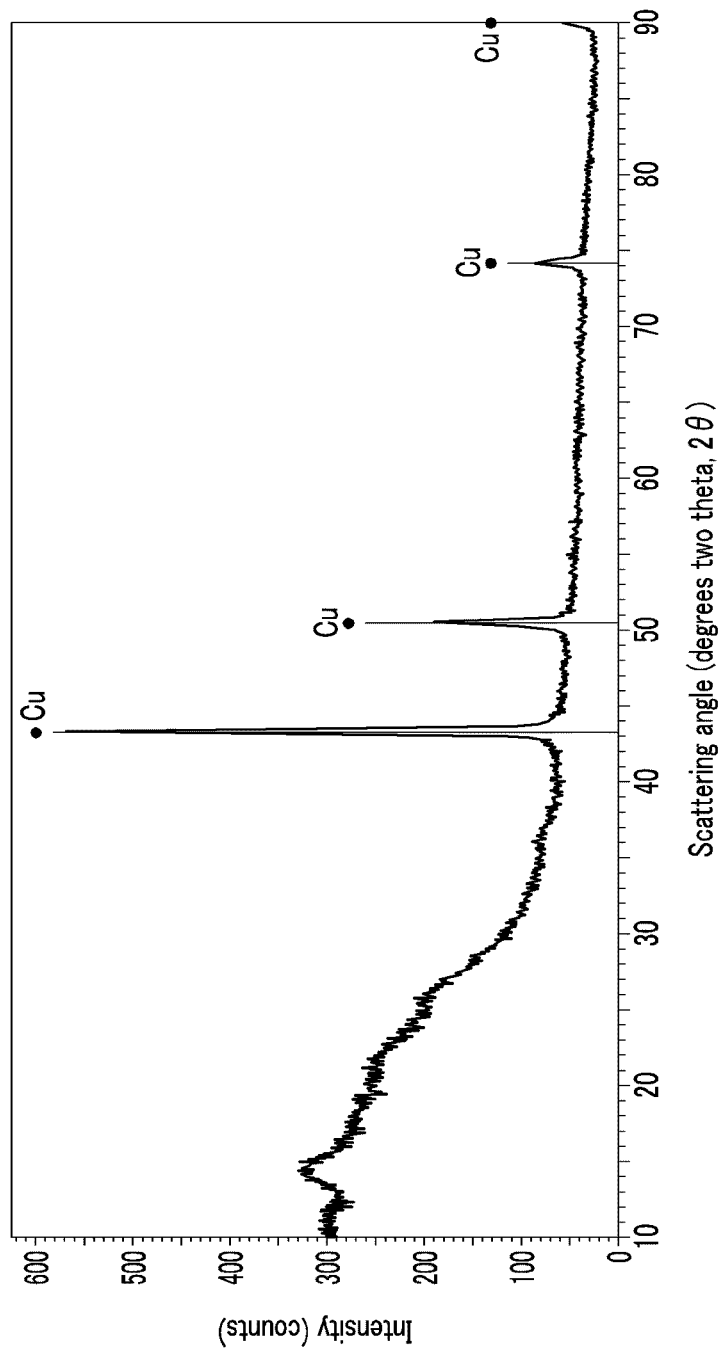
FIG. 9 is a graph of intensity (counts) versus scattering angle (degrees two-theta, 2θ) of X-ray diffraction analysis results of a metal pattern according to Example 2.

FIG. 9 shows the results of analysis of the metal pattern obtained from Example 2 by X-ray powder diffraction ("XRD," light source: CuKα radiation, scan rate: 5 degrees two-theta per minute). It is confirmed from FIG. 9 that of the copper is reduced to form Cu metal.

While this disclosure has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A metal pattern composition comprising:
a conductive metal or a conductive metal precursor compound; and
a carboxylic acid-amine base ion pair salt,
wherein the carboxylic acid-amine base ion pair salt is represented by the following Chemical Formula 2:

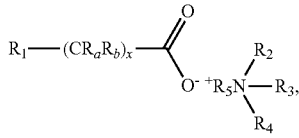

Chemical Formula 2 wherein, in the above Chemical Formula 2,
$R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C2 to C12 alkenyloxy, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, each of the foregoing being optionally substituted with an amino or carbonyl functional group,
$R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen,
$R_5$ is a hydrogen or a C1 to C7 alkyl,
$R_a$ and $R_b$ are the same or different, and are each independently a hydrogen or a C1 to C7 alkyl, and
x is an integer ranging from 0 to about 17.

2. The metal pattern composition of claim 1, wherein the conductive metal comprises a Group 3 to Group 12 element, a main group metal, or a combination thereof.

3. The metal pattern composition of claim 2, wherein the main group metal is a metal of Group 13 to Group 16.

4. The metal pattern composition of claim 1, wherein the conductive metal precursor compound is represented by the following Chemical Formula 1:

$$M_l L_n X_m$$  Chemical Formula 1 wherein, in Chemical Formula 1,
each M is independently a Group 3 to Group 12 element, a main group metal, or a combination thereof,
each L is independently an amine ligand, a phosphine ligand, a phosphite ligand, a phosphine oxide ligand, an arsine ligand, a thiol ligand, or a combination thereof,
each X is independently a hydrogen, a hydroxy, a halogen, a cyano, a cyanate, a carbonate, a nitrate, a nitrite, a sulfate, a sulfite, a phosphate, a chlorate, a perchlorate, a tetrafluoroborate, an acetylacetonate, a thiol, an amide, an alkoxy, a carboxylate, a β-diketonate, a β-ketoiminate, a β-diiminate, an oxo, a dialkyldithiocarbamate, a nitroxyl, an azide, a thiocyanate, an isothiocyanate, a tetraalkylborate, a tetrahaloborate, a hexafluorophosphate, a trifluoromethanesulfonate, tosylate, or a combination thereof, and
l is an integer ranging from 1 to about 10, n is an integer ranging from 0 to about 40, and m is an integer ranging from 0 to about 10, provided that both n and m are not 0.

5. The metal pattern composition of claim 1, wherein the conductive metal or the conductive metal precursor compound has an average largest particle diameter of about 1 to about 5000 nanometers.

6. The metal pattern composition of claim 1, wherein $R_1$ is represented by the following Chemical Formula 2-1:

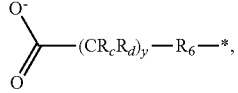

Chemical Formula 2-1 wherein, in the above Chemical Formula 2-1, $R_c$ and $R_d$ are the same or different, and are each independently a hydrogen or a C1 to C7 alkyl,
$R_6$ is a single bond, a substituted or unsubstituted C1 to C18 alkylene, a substituted or unsubstituted C3 to C20 cycloalkylene, or a substituted or unsubstituted C6 to C30 arylene, and
y is an integer ranging from 0 to about 17.

7. The metal pattern composition of claim 1, wherein at least one of $R_2$ to $R_4$ is represented by the following Chemical Formula 3-1:

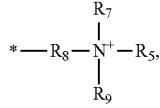

Chemical Formula 3-1 wherein, in the above Chemical Formula 3-1,
$R_7$ and $R_9$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl,
$R_5$ is a hydrogen or a C1 to C7 alkyl, and
$R_8$ is a substituted or unsubstituted C1 to C18 alkylene, a substituted or unsubstituted C2 to C18 alkenylene, a substituted or unsubstituted C3 to C20 cycloalkylene, a substituted or unsubstituted C7 to C30 alkylarylene, a substituted or unsubstituted C7 to C30 arylalkylene, or a substituted or unsubstituted C6 to C30 arylene.

8. The metal pattern composition of claim 1, wherein the metal pattern composition further comprises about 1 to about 99 weight percent of a metal ion derived from the conductive metal or the conductive metal precursor compound, based on the total weight of the metal pattern composition.

9. The metal pattern composition of claim 1, wherein the metal pattern composition comprises about 5 to about 70 weight percent of a metal ion derived from the conductive metal or the conductive metal precursor compound, based on the total weight of the metal pattern composition.

10. The metal pattern composition of claim 1, wherein the carboxylic acid-amine base ion pair salt is included in an amount of about 1 weight percent to about 99 weight percent, based on the total weight of the metal pattern composition.

11. The metal pattern composition of claim 1, wherein the carboxylic acid-amine base ion pair salt has a boiling point of about 80 to about 300° C., wherein the boiling point is measured using differential thermal analysis of a curved line of thermogravimetric analysis.

12. The metal pattern composition of claim 1, wherein the metal pattern composition has a viscosity of about 1 to about 100,000 centipoise.

13. The metal pattern composition of claim 1, wherein the metal pattern composition further comprises a conductive metal nanoparticle.

14. The metal pattern composition of claim 1, wherein the metal pattern composition further comprises an additive, wherein the additive is an adhesive, a dispersing agent, a binder resin, a reducing agent, a surfactant, a humectant, a viscoelasticity controlling agent, a leveling agent, or a combination thereof.

15. A method of manufacturing a metal pattern composition, the method comprising:
combining a conductive metal or a conductive metal precursor compound and a carboxylic acid-amine base ion pair salt to provide the metal pattern composition,
wherein the carboxylic acid-amine base ion pair salt is represented by the following Chemical Formula 2:

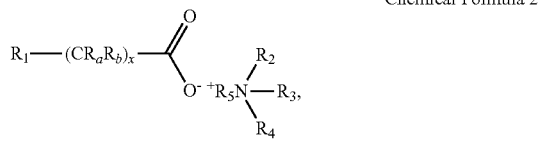

Chemical Formula 2 wherein, in the above Chemical Formula 2,
$R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C2 to C12 alkenyloxy, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, each of the foregoing being optionally substituted with an amino or carbonyl functional group,
$R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen,
$R_5$ is a hydrogen or a C1 to C7 alkyl,
$R_a$ and $R_b$ are the same or different, and are each independently a hydrogen or a C1 to C7 alkyl, and
x is an integer ranging from 0 to about 17.

16. A method of manufacturing a metal pattern composition comprising a carboxylic acid-amine base ion pair salt, the method comprising:
combining a conductive metal or a conductive metal precursor compound and a solvent;
adding a base that provides the base in the ion pair salt to the conductive metal or conductive metal precursor compound in the solvent; and
adding a carboxylic acid that provides the carboxylic acid in the ion pair salt to the combination of the base and the conductive metal or conductive metal precursor compound in the solvent, to provide the metal pattern composition,
wherein the carboxylic acid-amine base ion pair salt is represented by the following Chemical Formula 2:

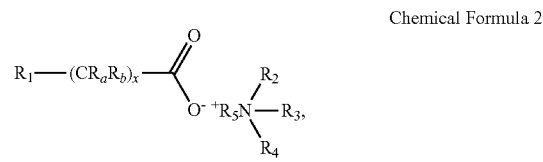

Chemical Formula 2 wherein, in the above Chemical Formula 2,
$R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C2 to C12 alkenyloxy, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, each of the foregoing being optionally substituted with an amino or carbonyl functional group,
$R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen,
$R_5$ is a hydrogen or a C1 to C7 alkyl,
$R_a$ and $R_b$ are the same or different, and are each independently a hydrogen or a C1 to C7 alkyl, and
x is an integer ranging from 0 to about 17.

17. A method of manufacturing a metal pattern, comprising:
preparing a substrate having a surface; and
forming the metal pattern on the surface of the substrate with a metal pattern composition comprising:
a conductive metal or a metal precursor compound, and
a carboxylic acid-amine base ion pair salt,
wherein the carboxylic acid-amine base ion pair salt is represented by the following Chemical Formula 2:

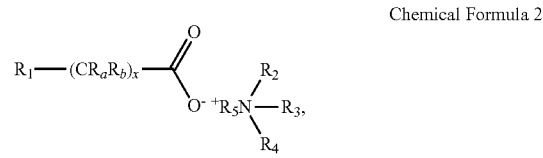

Chemical Formula 2 wherein, in the above Chemical Formula 2,
$R_1$ is a hydrogen, a substituted or unsubstituted C1 to C18 alkyl, a substituted or unsubstituted C2 to C18 alkenyl, a substituted or unsubstituted C1 to C12 alkoxy, a substituted or unsubstituted C2 to C12 alkenyloxy, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, each of the foregoing being optionally substituted with an amino or carbonyl functional group, $R_2$ to $R_4$ are the same or different, and are each independently a hydrogen, a substituted or unsubstituted C1 to C18 alkyl, a substituted or unsubstituted C2 to C18 alkenyl, a substituted or unsubstituted C3 to C20 cycloalkyl, a substituted or unsubstituted C6 to C30 aryl, a substituted or unsubstituted C7 to C30 alkylarylene, a substituted or unsubstituted C7 to C30 arylalkylene, or a substituted or unsubstituted C6 to C30 heteroaryl, provided that at least one of $R_2$ to $R_4$ is not hydrogen, $R_5$ is a hydrogen or a C1 to C7 alkyl, $R_a$ and $R_b$ are the same or different, and are each independently a hydrogen or a C1 to C7 alkyl, and x is an integer ranging from 0 to about 17.

18. The method of claim 17, further comprising annealing the metal pattern.

19. The method of claim 18, wherein the annealing is performed at about 100 to about 400° C.

20. The method of claim 17, wherein the metal comprises platinum, palladium, silver, gold, or a combination thereof.

21. The method of claim 17, wherein the metal pattern has a line resistance of about 50 to about 500 ohms per meter.

22. The method of claim 17, wherein the metal pattern has a resistivity about 3 to about 500 microohms centimeters.

23. The metal pattern composition of claim 2, wherein a metal of the conductive metal or the conductive metal precursor compound comprises copper.

24. The metal pattern composition of claim 4, wherein M comprises copper.

25. The metal pattern composition of claim 24, wherein the conductive metal precursor compound is copper hydroxide.

26. The metal pattern composition of claim 1, wherein x in Chemical Formula 2 is 0.

27. The metal pattern composition of claim 26, wherein $R_3$ to $R_5$ are hydrogen.

28. The metal pattern composition of claim 27,
wherein the carboxylic acid-amine base ion pair salt of Chemical Formula 2 is a formic acid salt, and
wherein a metal of the conductive metal or the conductive metal precursor compound comprises copper.

29. The metal pattern composition of claim 28, wherein the conductive metal or the conductive metal precursor compound is copper hydroxide.

* * * * *